United States Patent
Yanase

(10) Patent No.: US 6,764,606 B2
(45) Date of Patent: Jul. 20, 2004

(54) METHOD AND APPARATUS FOR PLASMA PROCESSING

(75) Inventor: Toshihiro Yanase, Takatsuki (JP)

(73) Assignee: Tokyo Electron Limited, Tokyo (JP)

( * ) Notice: Subject to any disclaimer, the term of this patent is extended or adjusted under 35 U.S.C. 154(b) by 77 days.

(21) Appl. No.: 09/793,079

(22) Filed: Feb. 27, 2001

(65) Prior Publication Data

US 2002/0117473 A1 Aug. 29, 2002

(51) Int. Cl.$^7$ .............................. C23F 1/00; B44C 1/22
(52) U.S. Cl. ........................ 216/75; 216/69; 216/74; 216/77; 216/78; 438/722; 438/723; 438/724; 438/905; 219/121.43; 134/1.1
(58) Field of Search .............................. 216/69, 74, 75, 216/77, 78; 219/121.43; 438/722, 723, 724, 905; 134/1.1

(56) References Cited

U.S. PATENT DOCUMENTS

| | | | |
|---|---|---|---|
| 5,024,716 A | * 6/1991 | Sato | 156/345.42 |
| 5,110,408 A | * 5/1992 | Fujii et al. | 216/75 |
| 5,423,945 A | 6/1995 | Marks et al. | 438/723 |
| 5,772,832 A | 6/1998 | Collins et al. | 156/345 |
| 5,861,601 A | * 1/1999 | Sato et al. | 219/121.43 |
| 6,040,243 A | * 3/2000 | Li et al. | 438/687 |
| 6,372,654 B1 | * 4/2002 | Tokashiki | 438/712 |
| 6,395,099 B1 | * 5/2002 | Pan | 134/19 |

* cited by examiner

Primary Examiner—Nadine G. Norton
Assistant Examiner—Shamim Ahmed
(74) Attorney, Agent, or Firm—Finnegan, Henderson, Farabow, Garrett & Dunner, LLP

(57) ABSTRACT

In a plasma processing apparatus according to the present invention, a gas inlet port and a discharge port are provided on a chamber for introducing and discharging gas into and from the chamber respectively. A sample to be etched is placed on an electrode part, so that a high-frequency power source applies a high-frequency bias to the sample. An electromagnet provided on the periphery of a plasma generation area generates a magnetic field while a waveguide connected to an upper potion of the chamber introduces a microwave into the plasma generation area through a microwave introduction window. Electron cyclotron resonance is excited for the gas for generating plasma. At least a surface of the microwave introduction window exposed to the plasma generation area is made of quartz, while the gas contains fluorine. The apparatus having the aforementioned structure can remove a material adhering to the surface of the microwave introduction window when the sample is etched.

6 Claims, 10 Drawing Sheets

METHOD AND APPARATUS FOR PLASMA PROCESSING

BACKGROUND OF THE INVENTION

1. Field of the Invention

The present invention relates to a technique of etching gold, platinum, iridium or a conductive metal oxide with plasma, and more particularly, it relates to a technique of cleaning a plasma etching apparatus introducing a microwave for generating plasma.

2. Description of the Prior Art

In a high-frequency device or a ferroelectric memory applied to a mobile communicator such as a portable telephone, for example, a metal such as gold, platinum or iridium is employed as the material for a wire or an electrode in an LSI. In an element employing a substrate of gallium arsenide as a high-frequency device, for example, gold is employed as the material for a gate electrode or the like due to requirement for the characteristics of the element. In a ferroelectric memory employing a metal oxide for a dielectric, oxidation resistance is required for an electrode material and gold, platinum or iridium having small reactivity is employed for the electrode material not to reduce the dielectric.

While an RIE (reactive ion etching) apparatus or the like is employed for patterning the metal, an etching apparatus such as an ECR (electron cyclotron resonance) plasma apparatus or a surface wave plasma etching apparatus employing high-density plasma is now being employed following refinement of devices.

Dissimilarly to silicon or aluminum, however, the aforementioned metal has small reactivity with plasma. When subjected to plasma processing, therefore, the metal is scattered from the processed material mainly by sputtering, to adhere to the inner part of a chamber of the plasma apparatus.

The material adhering to the inner part of the chamber in the aforementioned manner is conductive. In a plasma etching apparatus generating plasma with an electrode, generation of the plasma is not remarkably influenced by such a conductive material adhering to the electrode. In a plasma etching apparatus generating plasma by introducing a microwave, however, a conductive material adhering to a window for introducing the microwave reflects the microwave, to cause difficulty in generation of the plasma.

While the aforementioned metal partially reacts with chlorine or fluorine, a chloride or a fluoride of the aforementioned metal has low vapor pressure. Under ordinary pressure, for example, $AuF_3$ is sublimed at about 300° C., $PtF_6$ is vaporized at 69° C., $IrF_3$ is decomposed at 250° C., and $InF_3$ is vaporized at a temperature of at least 1200° C. Despite plasma processing, therefore, the reactant is hardly discharged as vapor but adheres to the inner part of the chamber, and this conductive reactant disadvantageously causes the aforementioned difficulty in generation of the plasma. When chlorine is employed as etching gas, further, this etching gas may corrode and damage a metal film or an insulator film of an aluminum alloy such as Al or AlSiCu or a high dielectric constant metal oxide such as SBT (strontium bismuth tantalate) or BST (barium strontium titanate), for example, separately formed on a substrate formed with the metal to be etched. Therefore, employment of chlorine is unpreferable.

While the electrode material to be etched may be prepared from a conductive oxide such as tin oxide, ruthenium oxide or iridium oxide or an oxide such as indium oxide or tantalum oxide attaining conductivity due to addition of an impurity in place of the aforementioned metal, this material also adheres to the inner part of the chamber, particularly the microwave introduction window, as a result of sputtering to cause the aforementioned problem.

SUMMARY OF THE INVENTION

An object of the present invention is to reduce inhibition of generation of plasma caused by a deposit in a technique of introducing a microwave through a microwave introduction window for generating plasma and performing etching on the basis of this plasma.

In order to attain the aforementioned object, a plasma processing method according to an aspect of the present invention introduces a microwave and gas into a chamber capable of storing a sample having a conductive layer through a microwave introduction mechanism and from a gas inlet port respectively for processing the conductive layer with plasma, while at least a part of the microwave introduction mechanism exposed to the plasma consists of quartz, the gas contains at least fluorine, and the part of quartz is etched at the same time during the processing.

In an example of this plasma processing method, the gas contains no halogen element but fluorine.

A plasma processing method according to another aspect of the present invention introduces a microwave and gas into a chamber capable of storing a sample having a conductive layer through a microwave introduction mechanism and from a gas inlet port respectively for processing the conductive layer with first plasma, while the sample is discharged and a part of the microwave introduction mechanism exposed to the first plasma is cleaned with second plasma when prescribed information changed by processing the conductive layer with the first plasma satisfies a prescribed condition.

According to this plasma processing method, the part of the microwave introduction mechanism exposed to the first plasma, to which a conductive material adheres as a result of processing the conductive layer with the first plasma, is cleaned with the second plasma after the sample is discharged, whereby the cleaning can be performed without damaging the material of the sample by the second plasma.

When the number of processed samples, for example, is employed as the prescribed information, the part of the microwave introduction mechanism exposed to the plasma can be prevented from adhesion of a large quantity of conductive material caused by processing an excessive number of samples.

When information reflecting the state of the first plasma, position information of a microwave matcher interposed between a microwave generation source and the chamber or a reflected power value of the microwave, for example, is employed as the prescribed information, the part of the microwave introduction mechanism exposed to the plasma is cleaned by detecting the state of the plasma changed by adhesion of the conductive material, whereby the part of the microwave introduction mechanism exposed to the plasma can be prevented from adhesion of a large quantity of conductive material.

In an example of this plasma processing method, at least the part of the microwave introduction mechanism exposed to the first plasma consists of quartz, and the second plasma is generated from gas containing fluorine.

The conductive layer contains gold, silver, copper, a platinum metal, indium, gallium, germanium, arsenic or phosphorus, an alloy of any of these metals, or a metal oxide.

A plasma processing apparatus according to still another aspect of the present invention comprises a chamber capable of storing a sample having a conductive layer to be etched with plasma, a gas inlet port for introducing gas containing fluorine into the chamber, and a microwave introduction mechanism, consisting of quartz at least in a part exposed to the plasma, for introducing a microwave for generating the plasma from the gas into the chamber.

The microwave introduction mechanism preferably has a microwave introduction window of quartz. The microwave introduction window of quartz is provided to fill up a through hole of a conductor member having the through hole, for example.

In an example of this plasma processing apparatus, the microwave introduction mechanism has a microwave introduction window and a separator, consisting of quartz at least in a part exposed to the plasma, for separating the microwave introduction window from the plasma. The microwave introduction window is formed by a conductor member having a through hole, for example.

According to the plasma processing apparatus having the aforementioned structure, the microwave introduced from the microwave introduction mechanism generates plasma from the gas containing fluorine. When the conductive layer or a compound thereof adheres to the part of the microwave introduction mechanism exposed to the plasma due to plasma processing, fluorine contained in the plasma etches this part of the microwave introduction mechanism, thereby preventing deterioration of introduction of the microwave.

A plasma processing apparatus according to a further aspect of the present invention comprises a sample holder, receiving a sample having a conductive layer to be etched with plasma, capable of applying high-frequency power to the sample, a sample holder cover, consisting of quartz at least in a part exposed to the plasma, for covering the periphery of the sample holder without coming into contact with the sample, a chamber capable of storing the sample holder and the sample holder cover, a gas inlet port for introducing gas containing fluorine into the chamber, and a microwave introduction mechanism for introducing a microwave for generating the plasma from the gas into the chamber.

According to the aforementioned structure, the conductive layer or a compound thereof will not adhere to the sample holder as a result of plasma processing. When the conductive layer or a compound thereof adheres to the sample holder cover, fluorine contained in the plasma etches the sample holder cover thereby preventing disturbance of application of the high-frequency power.

The upper end of the sample holder cover is preferably located downward beyond a position of the sample holder for receiving the sample. Thus, the upper end of the sample holder cover will not inhibit the sample from coming into contact with the sample holder, whereby the high-frequency power can be sufficiently applied to the sample.

A plasma processing apparatus according to a further aspect of the present invention comprises a chamber capable of storing a sample having a conductive layer to be etched with plasma, a gas inlet port for introducing gas into the chamber, and a microwave introduction mechanism for introducing a microwave for generating the plasma from the gas into the chamber, while the microwave introduction mechanism includes a waveguide for propagating the microwave, a microwave introduction window having microwave transmissibility interposed between the waveguide and the chamber, and reflection quantity detection means detecting the quantity of reflected microwave, and plasma for cleaning a part of the microwave introduction window exposed to the plasma is generated in the chamber when the quantity of the reflected microwave exceeds a prescribed level.

According to this structure, the quantity of the reflected microwave increased by a conductive material adhering to the microwave introduction window as a result of etching the conductive layer is so detected as to clean the microwave introduction window when the quantity of the reflected microwave is increased, whereby stable plasma processing can be carried out.

A plasma processing apparatus according to a further aspect of the present invention comprises a chamber capable of storing a sample having a conductive layer to be processed with plasma, a gas inlet port for introducing gas into the chamber and a microwave introduction mechanism for introducing a microwave for generating the plasma from the gas into the chamber, while the microwave introduction mechanism includes a waveguide for propagating the microwave, a microwave introduction window having microwave transmissibility interposed between the waveguide and the chamber, and a microwave matcher for matching the microwave with the plasma by controlling the position or the quantity of a member inserted into a part propagating the microwave, and plasma for cleaning a part of the microwave introduction window exposed to the plasma is generated in the chamber when the position or the quantity of the member of the microwave matcher inserted into the part propagating the microwave is out of a prescribed range.

According to this structure, the position or the quantity of insertion of the member of the microwave matcher changed by a conductive material adhering to the part of the microwave introduction window exposed to the plasma as a result of etching the conductive layer is so detected as to clean the microwave introduction window when the position or the quantity is out of the prescribed range, whereby stable plasma processing can be carried out.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
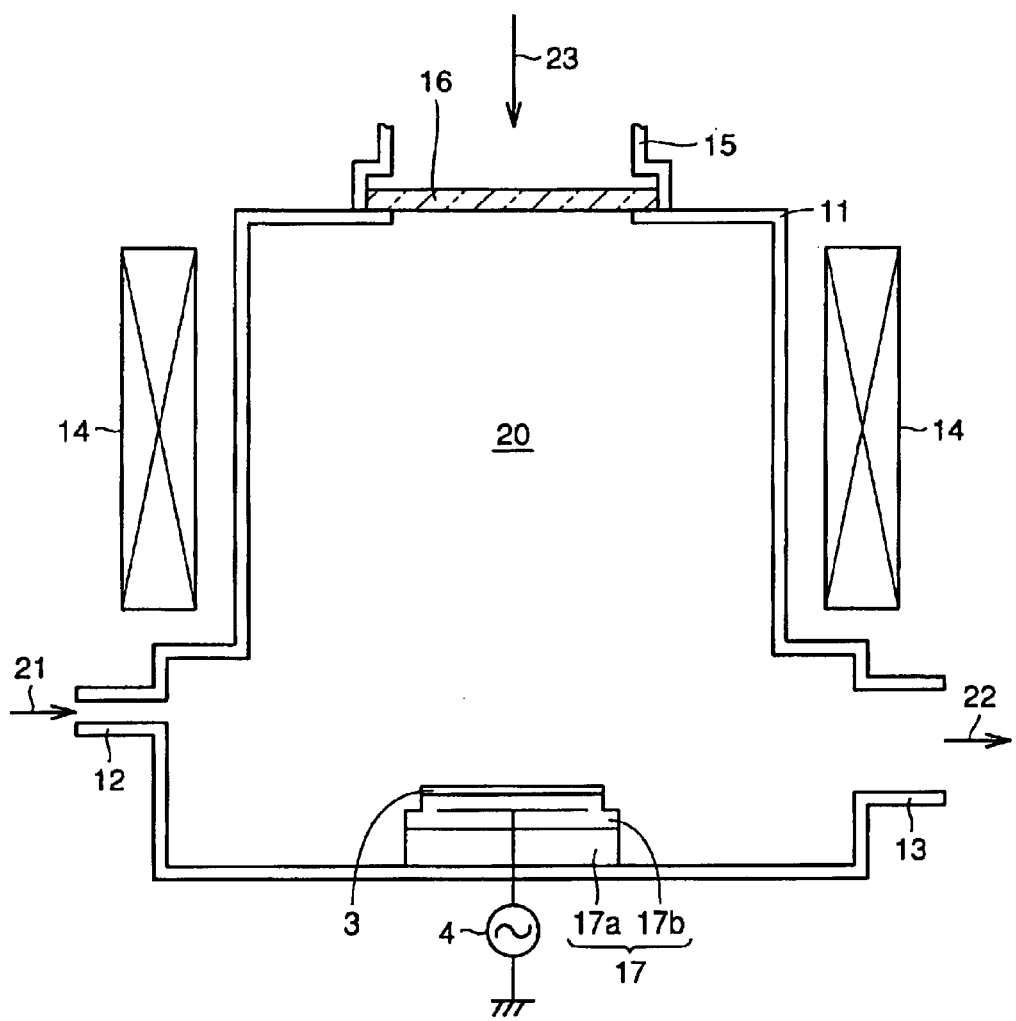
FIG. 1 is a sectional view schematically showing a first embodiment of the present invention.

FIG. 1 is a sectional view schematically showing an ECR plasma etching apparatus according to a first embodiment of the present invention. A chamber 11 is provided with a gas inlet port 12 and a discharge port 13, for introducing gas 21 by a gas introduction mechanism (not shown) and discharging the gas along arrow 22 by a discharge mechanism (not shown) respectively. The chamber 11 is provided therein with a sample holder 17, isolated from the chamber 11, having an electrode part 17b to which a high-frequency bias is applied by a high-frequency power source 4 and an isolation part 17a holding the electrode part 17b while isolating the same from the chamber 11. A sample 3 to be etched is placed on the electrode part 17b, so that the high-frequency power source 4 applies the high-frequency bias to the sample 3.

In the chamber 11, a plasma generation area 20 is located above the sample holder 17. An electromagnet 14 provided around the plasma generation area 20 generates a magnetic field while a waveguide 15 connected to an upper portion of the chamber 11 introduces a microwave 23 through a microwave introduction window 16 transmitting the microwave 23. Electron cyclotron resonance is excited for the gas 21 thereby generating plasma. The magnetic field generated by the electromagnet 14 is set to 875 G and the frequency of the microwave 23 is set to 2.45 GHz respectively, for example.

According to this embodiment, at least a surface of the microwave introduction window 16 exposed to the plasma generation area 20 is made of quartz while the gas 21 contains fluorine. When the sample 3 is etched, therefore, the surface of the microwave introduction window 16 made of quartz is also etched with the plasma containing fluorine, whereby a material adhering to the surface of the microwave introduction window 16 is removed during this etching. Even if a conductive material adheres to the microwave introduction window 16 when the sample 3 is etched, neither introduction of the microwave 23 is deteriorated nor generation of the plasma is inhibited.

Figure 2:
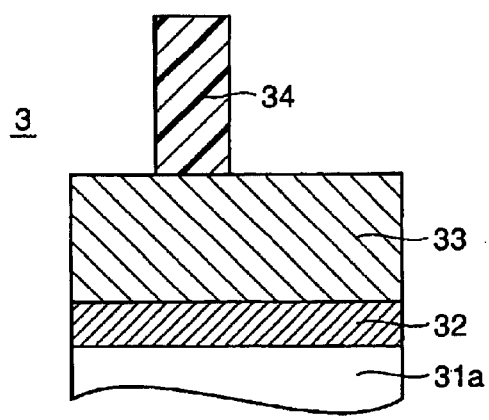
FIG. 2 is a sectional view schematically showing a sample employed in the first embodiment of the present invention.

FIG. 2 is a sectional view schematically showing an exemplary structure of the sample 3 employed in this embodiment. A titanium layer 32 and a gold layer 33 are stacked on a gallium arsenide substrate 31a in thicknesses of about 50 nm and about 500 nm respectively. A photoresist layer 34 formed with a pattern is provided on the gold layer 33 as an etching mask for patterning these layers 32 and 33.

When $C_4F_8$, $O_2$ or Ar gas is fed by 100, 10 or 50 sccm as the gas 21 and the microwave 23 is introduced into the chamber 11 while controlling the internal pressure of the chamber 11 to 10 mTorr by discharging the gas along arrow 22, for example, plasma is generated in the plasma generation area 20.

The high-frequency power source 4 applies a high-frequency bias of 400 kHz to the sample 3 at 100 W through the sample holder 17, thereby accelerating ions of fluorine etc. contained in the plasma toward the sample 3 and etching the gold layer 33 through the mask of the photoresist layer 34.

In the process of this etching, a fluoride of gold or sputtered gold is emitted. Most part of the fluoride of gold or the sputtered gold adheres to the inner part of the chamber 11 as well as to the microwave introduction window 16 due to low vapor pressure before the same is discharged from the discharge port 13. However, the surface of the microwave introduction window 16 opposed to the plasma generation area 20 is also etched by the plasma as described above, and hence the fluoride of gold or the sputtered gold is hardly deposited on the microwave introduction window 16.

The gold layer 33 of 500 nm in thickness can be etched at a rate of about 100 nm/min. by the aforementioned processing. When the aforementioned processing was continuously carried out on 25 samples 3 in practice, neither increase of reflected power of the microwave 23 nor remarkable displacement of matching was observed during this processing but the plasma was stably generated.

When the microwave introduction window 16 was covered with a silicon nitride ceramic member (not shown) employing a binder of yttrium oxide similarly to a general ECR plasma etching apparatus employing fluorine gas as a comparative example, reflected power of the microwave 23 exceeded 5% of incident power when about five samples 3 were processed. Therefore, it was impossible to etch subsequent samples 3. This is conceivably because fluoride of gold or gold was deposited on the surface of the silicon nitride ceramic member and this conductor reflected the microwave 23.

The etching gas employed in this embodiment can be prepared from fluorocarbon gas such as $CF_4$, $C_4F_8$ or $C_5F_8$, gas such as $SF_6$ containing fluorine or highly reactive fluorine-containing gas such as $NF_3$ or $F_2$, in response to the material to be etched and necessary etching performance. Further, $O_2$, $N_2$ or CO may be added to the material, in order to adjust the etching property of the etching gas. In addition, rare gas such as Ar may be employed as dilution gas, in order to improve stability of the plasma.

However, the etching gas more preferably contains no halogen but fluorine. Halogen other than fluorine may react with moisture to corrode the material for the substrate of the sample 3, the processed member or another member present on the substrate.

The frequency of the high-frequency power generated by the high-frequency power source 4 is not restricted to 400 kHz but may be set to 800 kHz, 2 MHz or 13.56 MHz in response to the etched material and necessary performance. However, the frequency of the high-frequency power is preferably not more than 5 MHz, more preferably not more than 2 MHz. A metal such as gold, platinum iridium or indium or a metal compound having low reactivity with plasma is etched mainly by sputtering caused by ion impact and accompanying reaction. Therefore, change of the applied high-frequency field must be so loose that the ions can follow this change, i.e., the frequency must be low, so that the ions are sufficiently accelerated by the high-frequency field. In an experiment of this embodiment, the etching rate was about 10 nm/min. when a high frequency of 13.56 MHz was applied, and about 110 nm when a high frequency of 2 MHz was applied.

The microwave introduction window 16 may be entirely made of quartz, or may be prepared by forming a quartz layer on another member. For example, a plate of quartz may be superposed on a plate of AlN ceramic, or a quartz layer may be formed on a plate of alumina by a method such as CVD. When the thickness of the quartz layer is reduced, the microwave-introduction window can be reproduced by forming the quartz layer again in this case, for reducing the running cost.

The present invention is particularly effective for etching gold, silver, copper, platinum or another platinum metal, indium, gallium, germanium, arsenic or phosphorus or an alloy of such a metal.

The technique of this embodiment is also effective for etching a conductive metal oxide such as tin oxide, ruthenium oxide or iridium oxide or a metal oxide such as indium oxide or tantalum oxide attaining conductivity due to addition of an impurity, since the microwave introduction window 16 can be prevented from deposition of such a material and stability of the plasma processing can be improved in this case.

Second Embodiment

Figure 3:
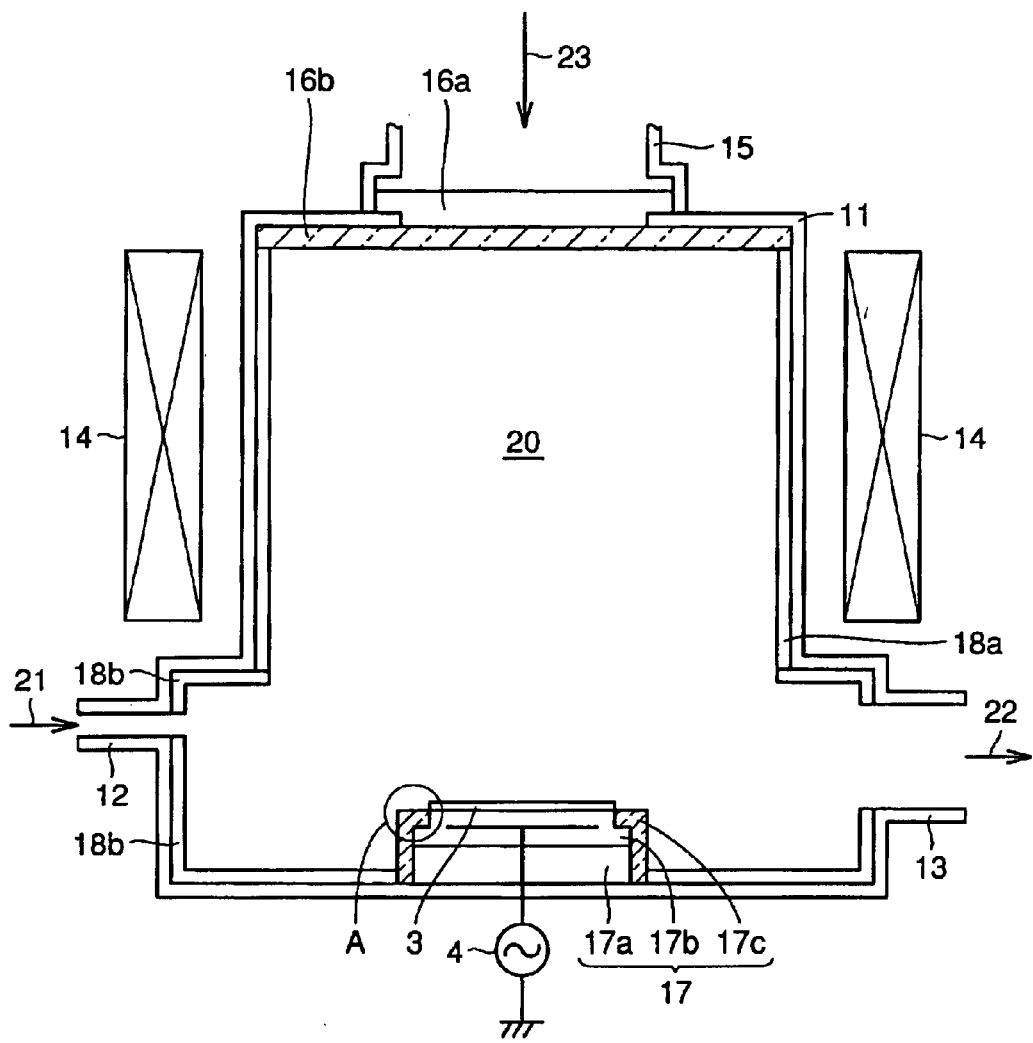
FIG. 3 is a sectional view schematically showing a second embodiment of the present invention.

FIG. 3 is a sectional view schematically showing the structure of an ECR plasma etching apparatus according to a second embodiment of the present invention. As compared with the structure shown in FIG. 1, an inner bell jar 18a and an anti-adhesion plate 18b are provided in a chamber 11 and a sample holder cover 17c of quartz is added to a sample holder 17, while a microwave introduction window 16a and a top plate 16b of quartz are provided in place of the microwave introduction window 16.

The inner bell jar 18a is arranged on a plasma generation area 20, and the anti-adhesion plate 18b is arranged under the plasma generation area 20. The inner bell jar 18a of aluminum, for example, may alternatively be made of ceramic such as quartz, alumina or AlN. The anti-adhesion plate 18b of quartz, for example, may alternatively be made of a metal such as aluminum or ceramic such as quartz, alumina or AlN.

Figure 4:
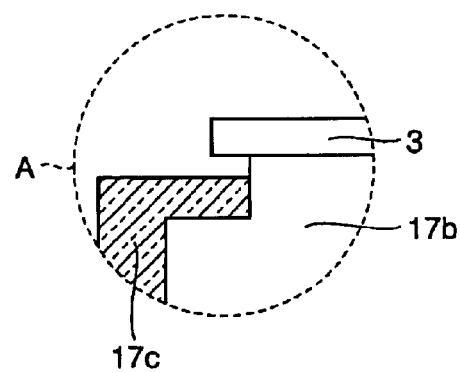
FIG. 4 is a sectional view showing an area A in FIG. 3 in an enlarged manner.

The sample holder cover 17c covers an isolation part 17a of the sample holder 17 for shielding the same from plasma. As shown in a sectional view of FIG. 4 illustrating an area A in FIG. 3 in an enlarged manner, the sample holder cover 17c preferably also covers the surface of an electrode part 17b. If the sample holder cover 17c projects upward beyond the electrode part 17b, however, a sample 3 so insufficiently comes into contact with the electrode part 17b that a high-frequency bias is insufficiently applied to the sample 3. Therefore, the upper surface of the sample holder cover 17c is preferably located downward beyond the upper surface of the electrode part 17b.

According to this embodiment, the top plate 16b of quartz serves as a separator for separating the microwave introduction window 16a from the plasma generation area 20. Further, gas 21 contains fluorine. Thus, the surface of the top plate 16b is also etched when the sample 3 is etched, whereby an effect similar to that of the first embodiment can be attained also when the microwave introduction window 16a is made of a material such as AlN, for example, not etched with fluorine plasma.

Further, the sample holder cover 17c of quartz covers the isolation part 17a, whereby no conductive material adheres to the isolation part 17a. A conductive material adhering to the sample holder cover 17c is removed by etching the sample holder cover 17c. Therefore, the high-frequency bias applied to the sample holder 17 is not disturbed by adhesion of a conductive material.

Figure 5:
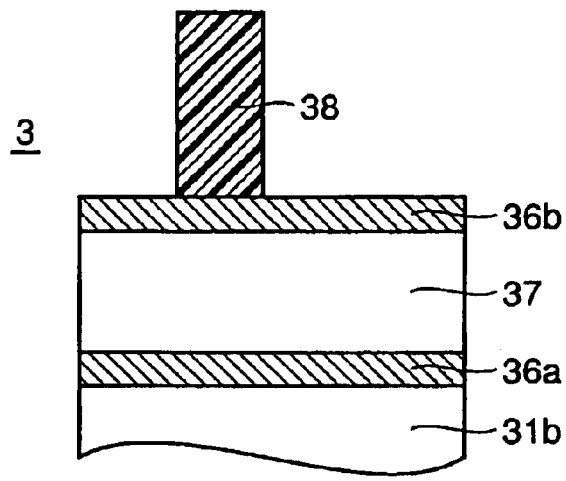
FIG. 5 is a sectional view schematically showing a sample employed in the second embodiment of the present invention.

FIG. 5 is a sectional view schematically showing an exemplary structure of the sample 3 employed in this embodiment. A platinum layer 36a, an SBT ($SrBi_2Ta_2O_9$) layer 37 and a platinum layer 36b are stacked on a silicon substrate 31b in thicknesses of about 100 nm, about 1 $\mu$m and about 100 nm respectively. A photoresist layer 38 formed with a pattern is provided on the platinum layer 36b as an etching mask for patterning these layers 36a, 37 and 36b.

When $CF_4$ or $O_2$ gas is fed by 200 or 10 sccm as the gas 21 and a microwave 23 is introduced into the chamber 11 while controlling the internal pressure of the chamber 11 to 5 mTorr by discharging the gas along arrow 22, for example, plasma is generated in the plasma generation area 20.

A high-frequency power source 4 applies a high-frequency bias of 2 MHz to the sample 3 at 100 W through the sample holder 17, thereby accelerating ions of fluorine etc. contained in the plasma toward the sample 3 and etching the platinum layer 36b through the mask of the photoresist layer 38.

In the process of this etching, a fluoride of platinum or sputtered platinum is emitted in the apparatus. Most part of the fluoride of platinum or the sputtered platinum adheres to the inner part of the chamber 11 as well as to the top plate 16b and the sample holder cover 17c due to low vapor pressure before the same is discharged from a discharge port 13. However, platinum or the fluoride thereof is hardly deposited on the top plate 16b and the sample holder cover 17c due to the aforementioned structure.

The platinum layer 36b of 100 nm in thickness can be etched at a rate of about 50 nm/min. by the aforementioned processing. In practice, neither increase of reflected power of the microwave 23 nor remarkable displacement of matching was observed but the plasma was stably generated. Also as to the high-frequency power applied from the high-frequency power source 4, neither increase of reflected power nor abnormal discharge around the sample holder 17 was observed and the etching rate was not reduced.

The sample holder cover 17c and the top plate 16b may not be provided together since these members can effectively function independently of each other. Therefore, only either the top plate 16b or the sample holder cover 17c can be employed.

Each of the sample holder cover 17c and the top plate 16b may be entirely made of quartz as described above, or may be prepared by forming a quartz layer on the surface of another member. For example, a member of quartz may be superposed on a member of AlN ceramic, or a quartz layer may be formed on a member of alumina by a method such as CVD. When the thickness of the quartz layer is reduced, the sample holder cover 17c or the top plate 16b can be reproduced by forming the quartz layer again in this case, for reducing the running cost.

The sample holder cover 17c may cover only a portion of the isolation part 17a around the electrode part 17b, or only the portion around the electrode part 17b may be made of quartz while preparing the remaining portion from alumina, aluminum or the like.

Third Embodiment

Figure 6:
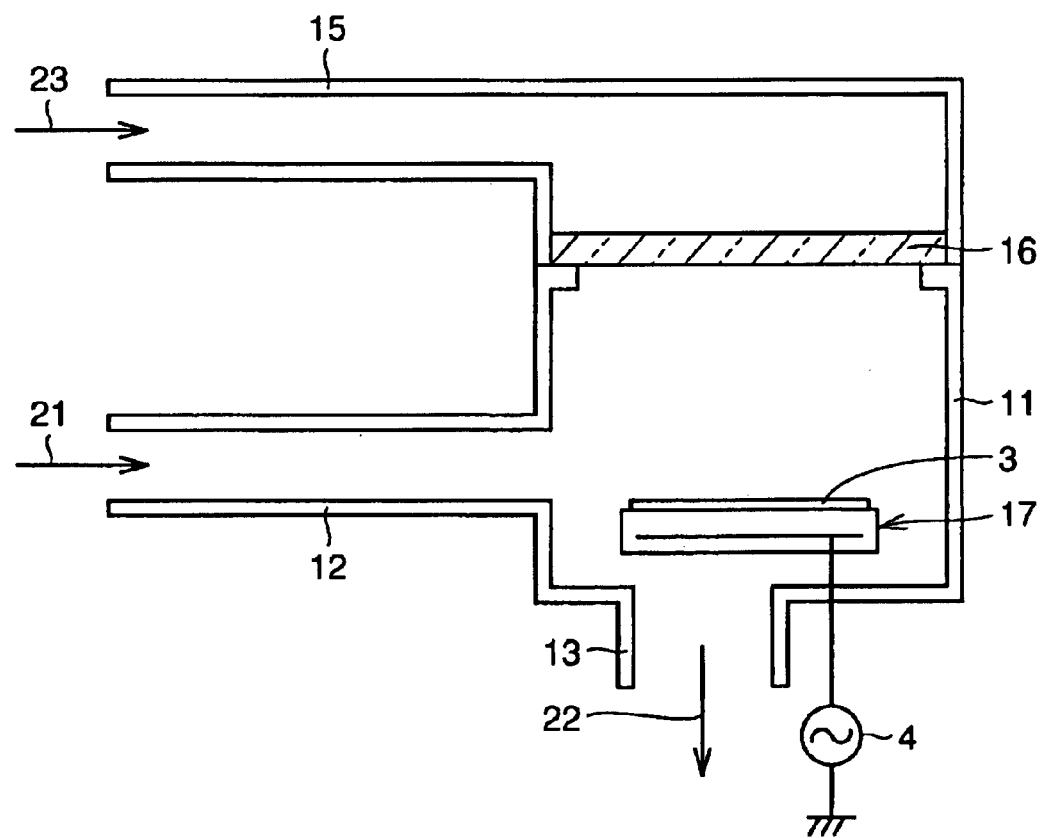
FIG. 6 is a sectional view schematically showing a third embodiment of the present invention.

FIG. 6 is a sectional view schematically showing the structure of a microwave plasma etching apparatus according to a third embodiment of the present invention. Also in this apparatus, a chamber 11 is provided with a gas inlet port 12 and a discharge port 13, for introducing gas 21 by a gas introduction mechanism (not shown) and discharging the gas along arrow 22 by a discharge mechanism (not shown) respectively, similarly to the apparatus according to the first embodiment. The chamber 11 is provided therein with a sample holder 17, isolated from the chamber 11, to which a high-frequency bias is applied by a high-frequency power source 4. A sample 3 to be etched is placed on the sample holder 17, so that the high-frequency power source 4 applies the high-frequency bias to the sample 3.

A waveguide 15 is connected to an upper portion of the chamber 11 for introducing a microwave 23 through a microwave introduction window 16 of quartz. However, no electromagnet 14 is provided dissimilarly to the ECR plasma etching apparatus but an electric field generated under the microwave introduction window 16 (on the side of the chamber 11) generates plasma from the gas 21. The present invention is also applicable to such a plasma etching apparatus other than the ECR apparatus.

The microwave introduction window 16 may be isolated from the chamber 11 by a top plate 16b of quartz or a sample holder cover 17c of quartz may be provided on the sample holder 17 similarly to the second embodiment, as a matter of course. Further, an inner bell jar 18a and an anti-adhesion plate 18b may be provided on other portions.

The sample 3 has the structure shown in FIG. 2, for example. When $C_4F_8$, $O_2$ or Ar gas is fed by 100, 10 or 50 sccm as the gas 21 and the microwave 23 of 2.45 GHz is introduced into the chamber 11 while controlling the internal pressure of the chamber 11 to 50 mTorr by discharging the gas along arrow 22, for example, plasma is generated in the chamber 11.

The high-frequency power source 4 applies a high-frequency bias of 400 kHz to the sample 3 at 100 W through the sample holder 17, thereby etching a gold layer 33 similarly to the first embodiment.

In the process of this etching, a fluoride of gold or sputtered gold is emitted in the apparatus and adheres to the microwave introduction window 16. However, gold or the fluoride thereof is hardly deposited on the microwave introduction window 16 as hereinabove described.

The gold layer 33 of 500 nm in thickness can be etched at a rate of about 170 nm/min. by the aforementioned processing. During this processing carried out in practice, neither increase of reflected power of the microwave 23 nor remarkable displacement of matching was observed but the plasma was stably generated.

Also when the aforementioned processing was continuously carried out on 25 samples 3 in practice, neither increase of reflected power of the microwave 23 nor remarkable displacement of matching was observed but plasma was stably generated.

Figure 7:
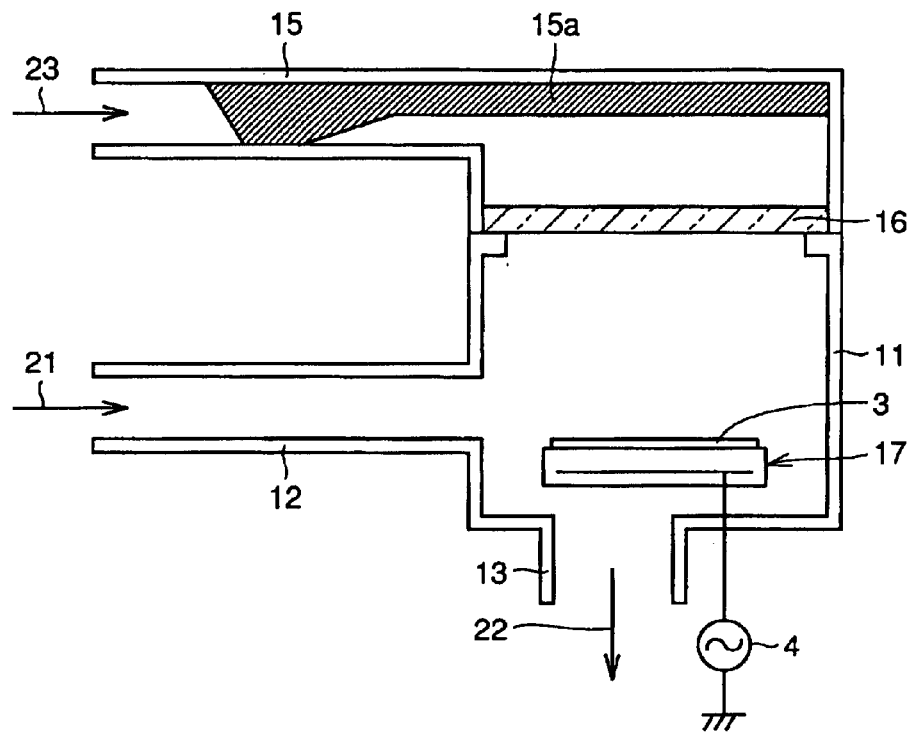
FIG. 7 is a sectional view showing a first modification of the third embodiment of the present invention.
Figure 8:
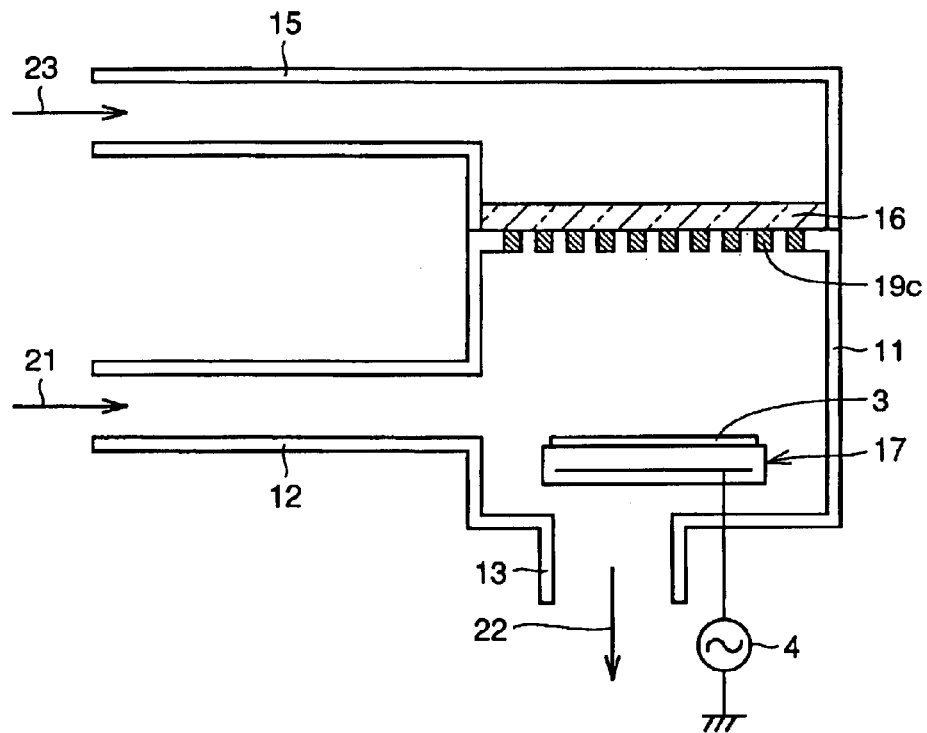
FIG. 8 is a sectional view showing a second modification of the third embodiment of the present invention.

FIG. 7 shows a surface wave plasma apparatus, for example, according to a first modification of the apparatus according to the third embodiment. According to the first modification, a dielectric member 15a can be set in a waveguide 15, as shown in FIG. 7. FIG. 8 shows a second modification of the apparatus according to the third embodiment. As shown in FIG. 8, a conductor member 19c having through holes for selectively introducing a microwave 23 into a chamber 11 may be provided on the side of the chamber 11.

Figure 9:
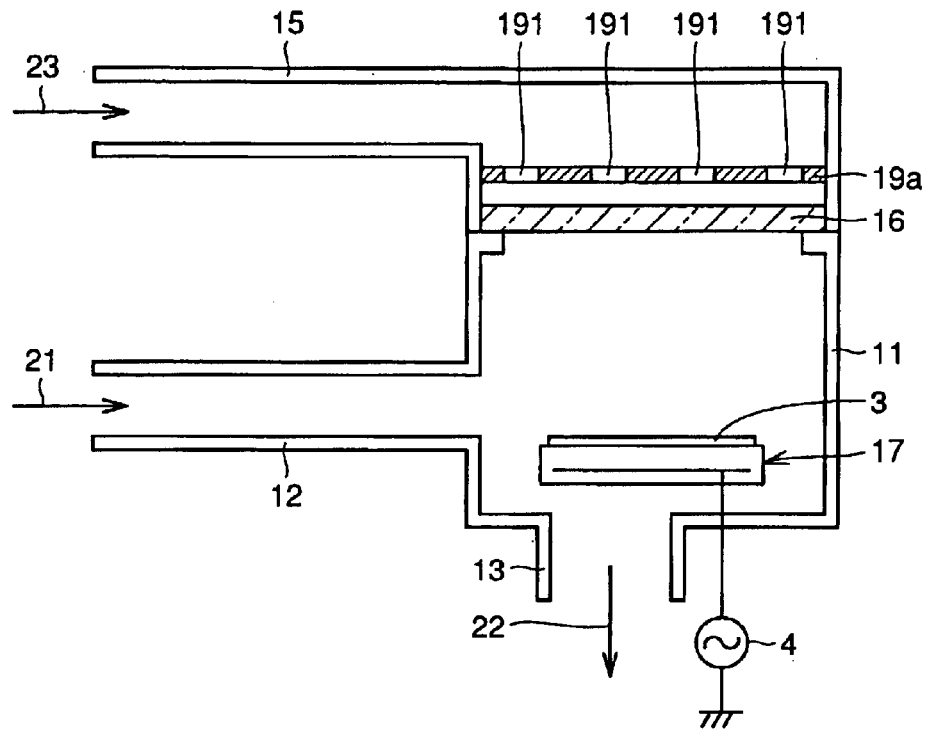
FIG. 9 is a sectional view showing a third modification of the third embodiment of the present invention.
Figure 10:
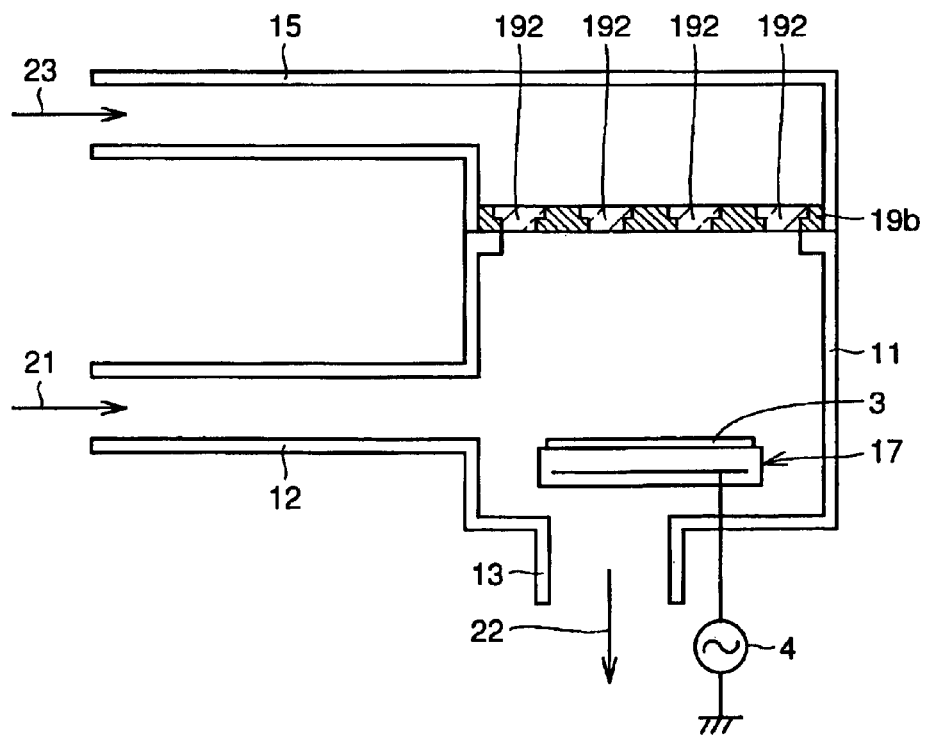
FIG. 10 is a sectional view showing a fourth modification of the third embodiment of the present invention.

FIG. 9 is a sectional view showing the structure of a third modification of the apparatus according to the third embodiment, in which a conductor member 19a having through holes 191 is added to the structure shown in FIG. 6. The conductor member 19a is isolated from a chamber 11 by a microwave introduction window 16, so that the conductor member 19a is not exposed to plasma and no conductive material adheres to the conductor member 19a in plasma processing carried out on a sample 3. The conductor member 19a may be brought into close contact with the microwave introduction window 16 or separated from the microwave introduction window 16 by a constant distance, for controlling distribution of an electric field in the chamber 11. In this mode, the conductor member 19a and the microwave introduction window 16 can be grasped as the microwave introduction window and a separator of quartz respectively.

FIG. 4 is a sectional view showing the structure of a fourth modification of the apparatus according to the third embodiment, in which the microwave introduction window 16 in the structure shown in FIG. 6 is replaced with a conductor member 19b having through holes 192. The through holes 192 are filled up with quartz, and can also be regarded as filled up with microwave introduction windows of quartz. Therefore, no conductive material is deposited on the through holes 192 in plasma processing carried out on a sample 3.

Figure 11:
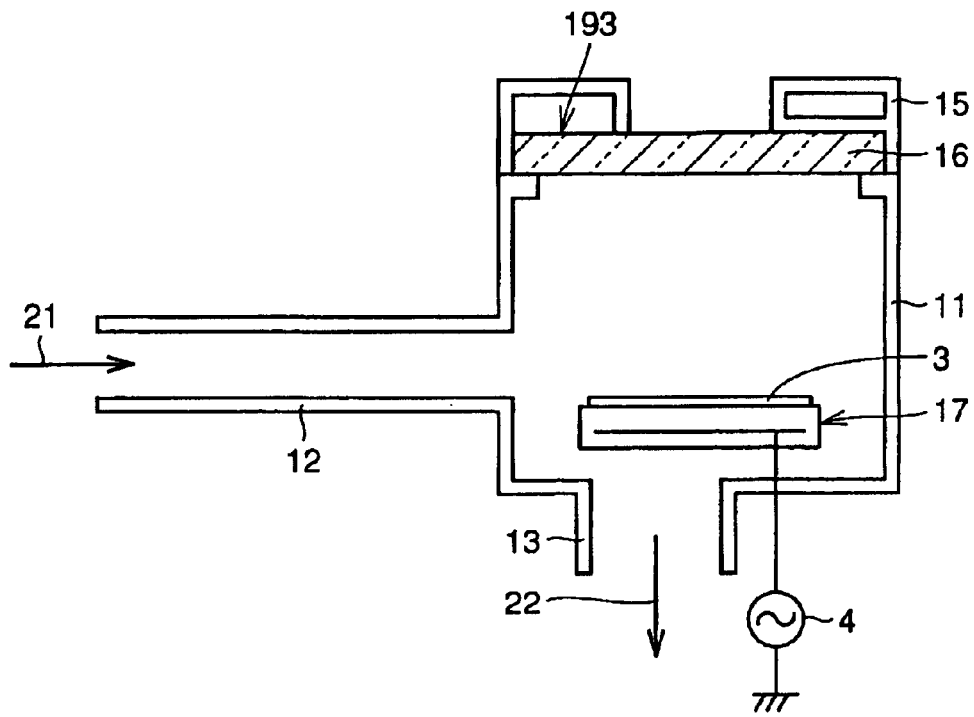
FIG. 11 is a sectional view showing a fifth modification of the third embodiment of the present invention.
Figure 12:
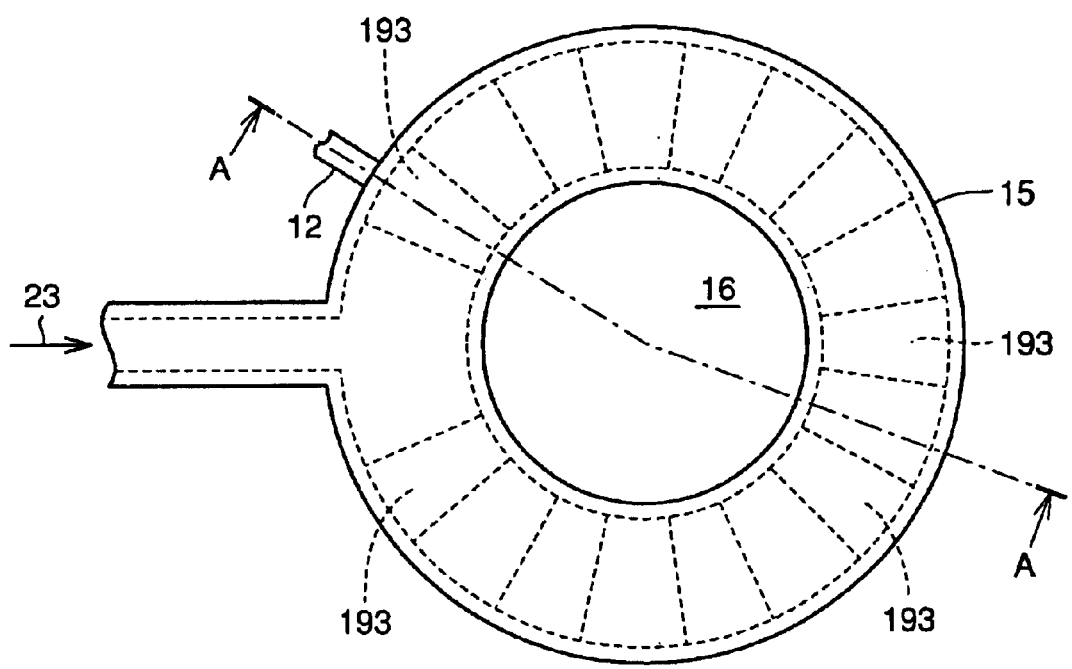
FIG. 12 is a top plan view of the structure shown in FIG. 11.

In each of the structures shown in FIGS. 6 to 10, the waveguide 15 provided on the microwave introduction window 16 may have a circular shape. FIG. 11 is a sectional view showing the structure of a fifth modification of the apparatus according to the third embodiment employing a waveguide 15 having a circular shape on the microwave introduction window 16 in the structure shown in FIG. 6, and FIG. 12 is a top plan view thereof. FIG. 11 corresponds to a section taken along a bent virtual line A—A in FIG. 12.

The waveguide 15 periodically has through holes 193 opening for the microwave introduction window 16 in the circular shape on the microwave introduction window 16. Distribution of an electric field formed on the side of a chamber 11 from the microwave introduction window 16 can be improved by controlling dimensions so that a microwave 23 introduced into the waveguide 15 forms a standing wave in the circular shape and locating the through holes 193 on portions corresponding to loops of the standing wave. Also in this mode, gas 21 can be so set that no conductive material is deposited on the microwave introduction window 16.

Fourth Embodiment

Figure 13:
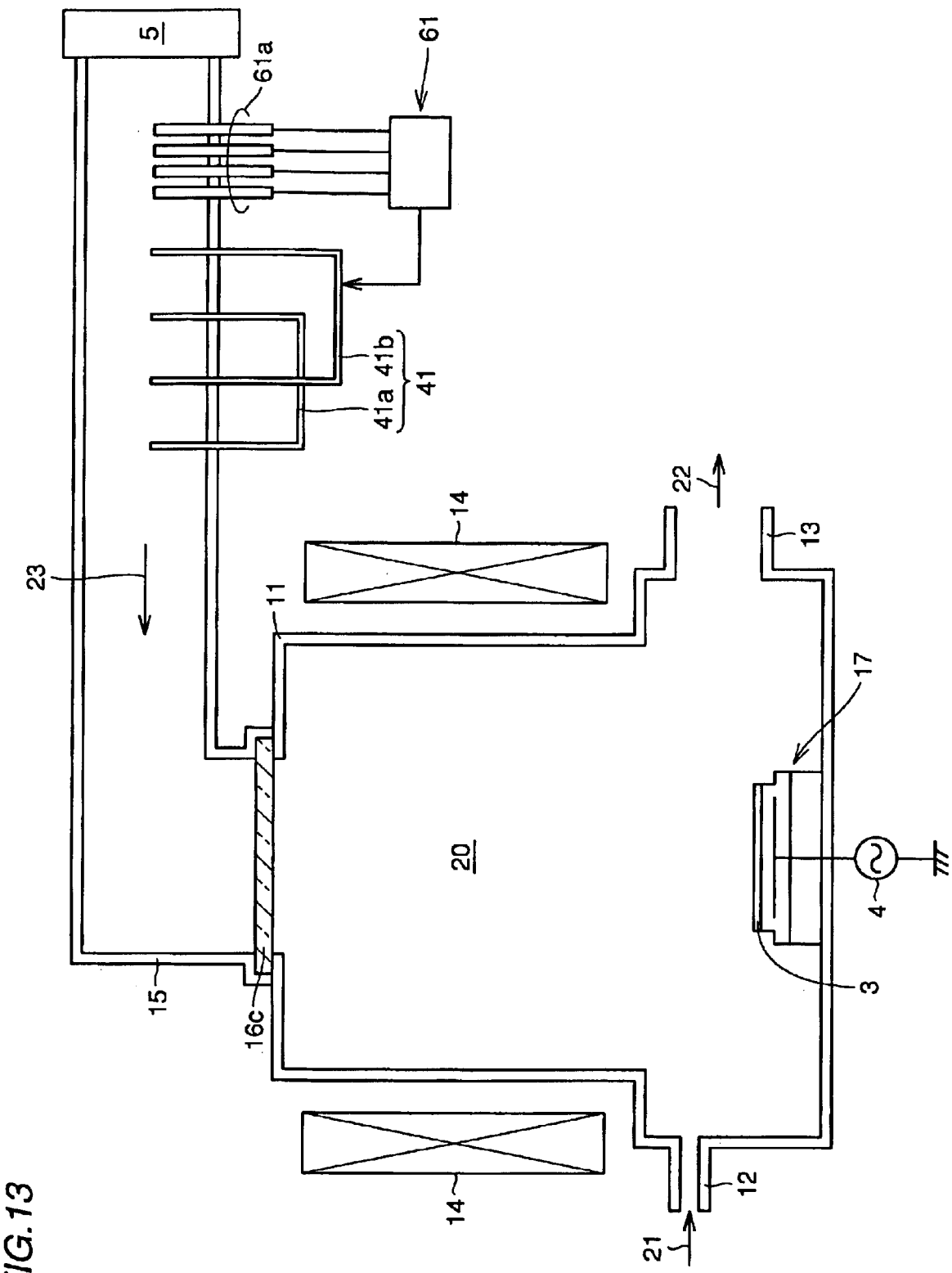
FIG. 13 is a sectional view schematically showing a fourth embodiment of the present invention.

FIG. 13 is a sectional view schematically showing the structure of an ECR plasma etching apparatus according to a fourth embodiment of the present invention. The fourth embodiment is different in structure from the first embodiment in a point that a stub microwave matcher 41 and a standing wave measurer 61 are provided on a waveguide 15. A microwave oscillator 5 is connected to the waveguide 15 on a side separate from the stub microwave matcher 41 and the standing wave measurer 61 as viewed from a chamber 11. According to this embodiment, a plasma introduction window 16c is not cleaned simultaneously with plasma processing on a sample 3.

The stub microwave matcher 41 includes two stubs 41a and 41b. Each of the stubs 41a and 41b is formed by a pair of metal bars coupled with each other, for matching the microwave oscillator 5 with plasma generated in the chamber 11 and reducing reflection of a microwave 23 from the plasma by adjusting the quantity of the pair of metal bars inserted into the waveguide 15. The quantity of such reflection can be calculated on the basis of a standing wave ratio obtained by the standing wave measurer 61 having probes 61a inserted into the waveguide 15. Therefore, control regularly directed to impedance matching can be performed as to insertion of the stubs 41a and 41b by controlling the quantities of the two stubs 41a and 41b inserted into the waveguide 15 respectively on the basis of a result of measurement of the standing wave measurer 61. The quantities of insertion of the stubs 41a and 41b into the waveguide 15 are rendered measurable as match position information TUNE1 and TUNE2 respectively. Insertion of the stubs 41a and 41b into the waveguide 15 may not be restricted to the mode based on feedback from the standing wave measurer 61, as a matter of course. Further, the stub microwave matcher 41 may be replaced with another type of matcher such as a 4E tuner having an E stub provided on a waveguide for varying the internal length of the stub by changing the position of a short plate provided therein thereby attaining matching.

Figure 14:
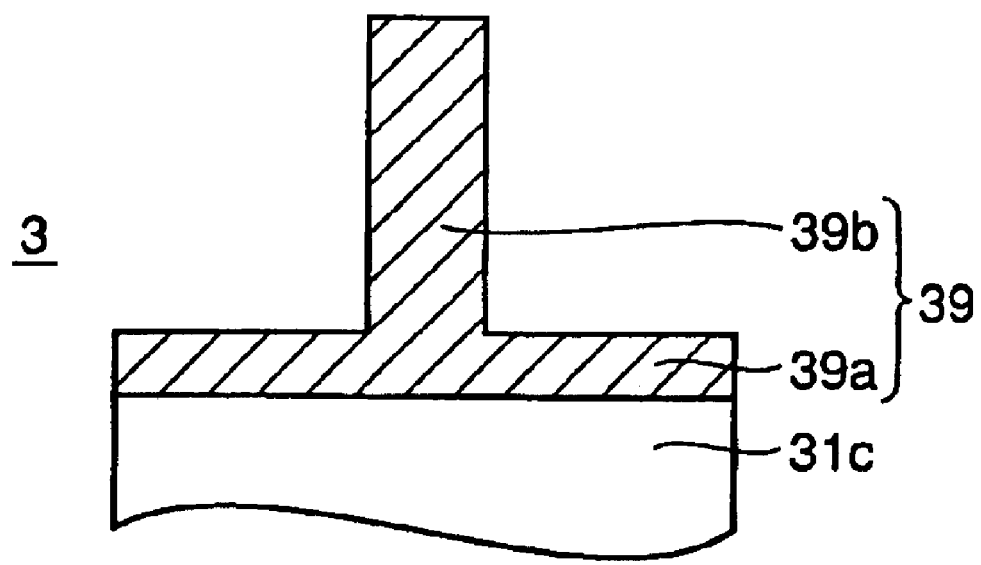
FIG. 14 is a sectional view schematically showing a sample employed in the fourth embodiment of the present invention.

FIG. 14 is a sectional view schematically showing an exemplary structure of a sample 3 employed this embodiment. An iridium layer 39 is formed on a substrate 31c of a silicon oxide. The iridium layer 39 consists of a flat layer 39a formed on the overall surface of the substrate 31c in a thickness of 1 $\mu$m and a projection 39b formed on a part of the flat layer 39a in a thickness of 5 $\mu$m. This sample 3 can be regarded as subjected to etching by a thickness of 1 $\mu$m with a metal mask of 5 $\mu$m in height.

When the overall surface of the sample 3 is homogeneously etched by 1 $\mu$m, a shape partially having an iridium projection of 5 $\mu$m in height can be obtained by entirely removing the flat layer 39a except the portion located immediately under the projection 39b and exposing the substrate 31c. However, it is unpreferable to employ fluorine for plasma gas but Ar hardly etching a silicon oxide film is employed as gas 21 for removing iridium by sputtering, in order not to etch the substrate 31c of the silicon oxide.

The sample 3 is placed on a sample holder 17 and a magnetic field of 875 G is formed in a plasma generation area 20 by an electromagnet 14, while the gas 21 of Ar is fed into the chamber 11 by 500 sccm and the internal pressure of the chamber 11 is controlled to 10 mTorr by discharging the gas along arrow 22. A microwave 23 of 2.45 GHz is introduced into the chamber 11 thereby generating plasma in the plasma generation area 20. Thereafter a high-frequency bias of 400 kHz is applied to the sample 3 through the sample holder 17 at 100 W. The iridium layer 39 is sputtered by the aforementioned operation.

According to this embodiment, the plasma contains no fluorine and hence sputtered iridium partially adheres to a microwave introduction window 16c and is deposited thereon. When this processing is continued with no cleaning, the thickness of iridium deposited on the microwave introduction window 16c is gradually increased. The deposited iridium is conductive and hence reflection of the microwave 23 is so increased that no microwave 23 is finally introduced into the chamber 11 to generate plasma.

In order to prevent this phenomenon, increase of the quantity of the conductive material deposited on the microwave introduction window 16c is detected through information reflecting the state of the plasma or the like in this embodiment. The microwave introduction window 16c is cleaned when the information is out of a proper range. Alternatively, a sample holder cover 17c may be employed similarly to the second embodiment, as a matter of course.

More specifically, the aforementioned match position information TUNE1 and TUNE2 is employed as the information reflecting the state of the plasma. A lower limit L1 and an upper limit H1 are employed as the proper range for the match position information TUNE1, while a lower limit L2 and an upper limit H2 are employed as the proper range for the match position information TUNE2. The values L1, L2, H1 and H2 are lower limits and upper limits of the match position information TUNE1 and TUNE2 in normal etching with stable plasma, for example. These values L1, L2, H1 and H2 can be previously set.

The microwave introduction window 16c of quartz is cleaned by introducing gas 21 containing fluorine and generating plasma independently of the plasma for processing the sample 3 and removing an iridium deposition film adhering to the microwave introduction window 16c with the generated plasma.

When deposition of iridium on the microwave introduction window 16c is increased, the impedance of the chamber 11 as viewed from the microwave matcher 41 is changed to change the match position information TUNE1 and TUNE2 due to feedback from the standing wave measurer 61. When these data are monitored, therefore, increase of the quantity of iridium deposited on the microwave introduction window 16c can be detected.

Figure 15:
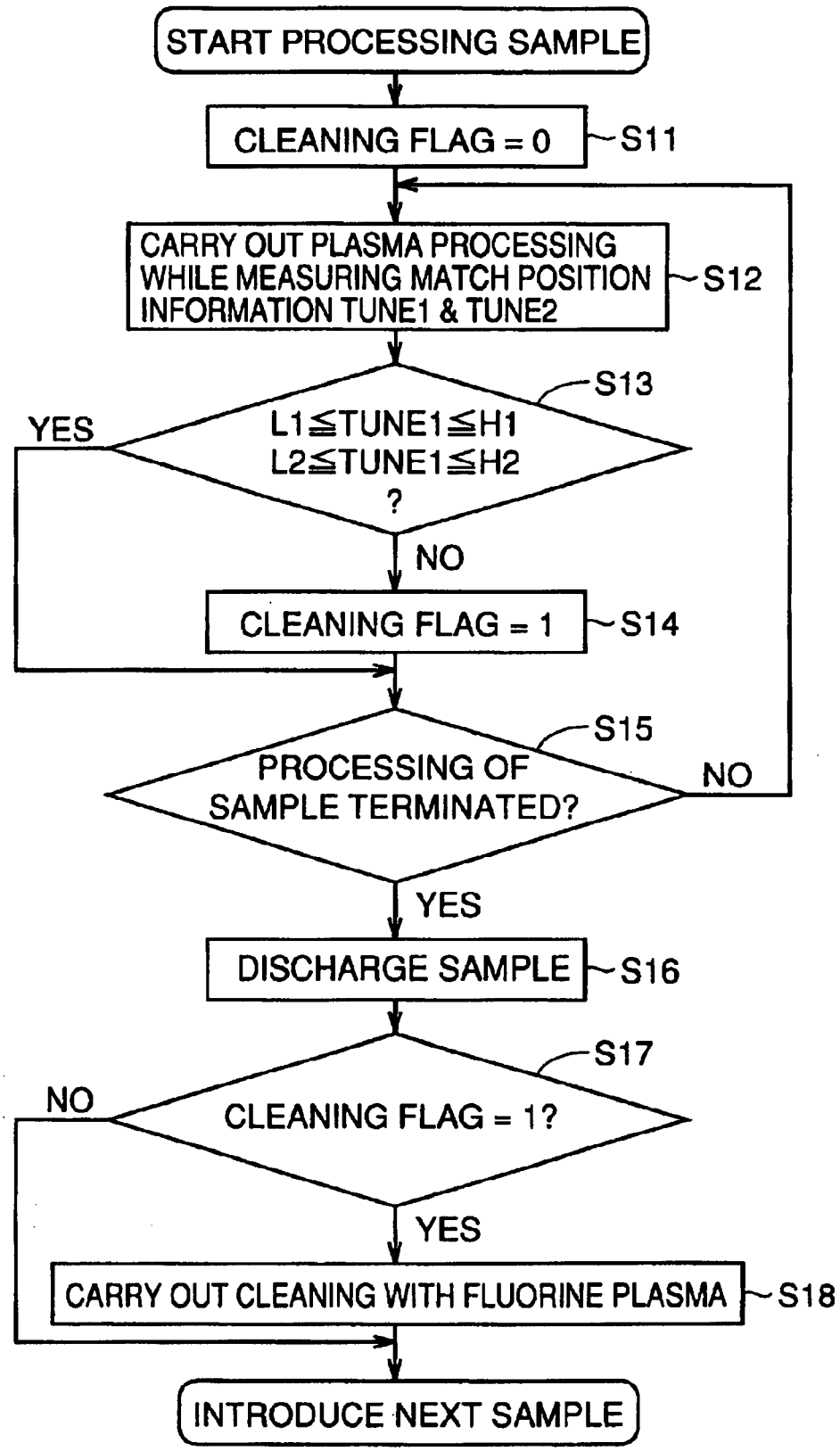
FIG. 15 is a flow chart showing cleaning according to the fourth embodiment of the present invention.

FIG. 15 is a flow chart showing the cleaning according to this embodiment. When starting plasma processing of the sample 3, a cleaning flag indicating whether or not to clean the microwave introduction window 16c is set to zero at a step S11. When the value of the cleaning flag is 0/1, the microwave introduction window 16c is not cleaned/cleaned in this embodiment.

Thereafter plasma processing such as etching, for example, is carried out on the sample 3 while measuring the match position information TUNE1 and TUNE2 (step S12). While the process advances from the step S12 to steps S13 and S14 for convenience of the flow chart, the plasma processing on the sample 3 is carried out also through the steps S13 and S14 and a step S15.

At the step S13, a determination is made as to whether or not the match position information TUNE1 and TUNE2 is in the proper ranges. In other words, a determination is made as to whether or not the match position information TUNE1 is in excess of the lower limit L1 and not more than the upper limit H1 and whether or not the match position information TUNE2 is in excess of the lower limit L2 and not more than the upper limit H2, and the process advances to the step S15 when both conditions are satisfied. If either condition is not satisfied, the process advances to the step S14 for setting the cleaning flag to 1.

During the plasma processing, a control unit (not shown) may automatically perform the measurement of the match position information TUNE1 and TUNE2 and the determination at the step S13.

When the plasma processing is determined as terminated at the step S15, the process advances to a step S16 for discharging the sample 3. When the plasma processing is not yet terminated, the process returns to the step S12 for continuing the plasma processing.

After the sample 3 is discharged, the value of the cleaning flag is checked at a step S17. If the value of the cleaning flag is 1, a determination of YES is made at the step S17 and the process advances to a step S18 for cleaning the microwave introduction window 16c. If the value of the cleaning flag is zero, a determination of NO is made at the step S17 and a next sample 3 is introduced.

At the step S18, $CF_4$ or $O_2$ gas is fed by 20 or 10 sccm as the gas 21 while setting the internal pressure of the chamber 11 to 3 mTorr by discharging the gas along arrow 22. Plasma is generated for etching the microwave introduction window 16c of quartz while simultaneously removing iridium deposited on the microwave introduction window 16c. This cleaning is carried out for 5 minutes, for example. When the step S18 is terminated, the next sample 3 is introduced.

In an experiment according to this embodiment, the match position information TUNE1 and TUNE2 was out of the proper ranges when five samples were processed. Therefore, the microwave introduction window 16c was cleaned after the fifth sample was processed with plasma. After the microwave introduction window 16c was cleaned, a next sample was processed. At this time, the match position information TUNE1 and TUNE2, which was out of the proper ranges before the cleaning, was within the proper ranges.

The gas for generating the plasma for cleaning the microwave introduction window 16c can be prepared from fluorocarbon gas such as $CF_4$, $C_4F_8$ or $C_5F_8$, gas such as $SF_6$ containing fluorine or highly reactive fluorine-containing gas such as $NF_3$ or $F_2$, while gas such as $O_2$, $N_2$, CO or Ar may be added thereto. In the aforementioned example, no sample is placed on the sample holder 17 when the microwave introduction window 16c is cleaned, and hence the sample holder 17 is also cleaned with the plasma. If the sample holder 17 must be protected against the plasma for cleaning the microwave introduction window 16c, a step of introducing/discharging a dummy wafer to be placed on the sample holder 17 in place of the sample for protecting the sample holder 17 may be carried out immediately before/after the step S18.

Power of the reflected microwave may be employed as the information reflecting the state of the plasma. This power can be detected by setting a reflected microwave power measurer on the waveguide 15. An upper limit H3 of the power of the microwave reflected in a normal state where no conductive material is deposited on the microwave introduction window 16c is previously set to be compared with the power of the microwave reflected during plasma processing of the sample. Referring to FIG. 15, the processing at the step S12 may be reread as "carry out plasma processing while measuring power Pr of reflected microwave" and the processing at the step S13 may be reread as "PR≦H3?".

The number of processed samples can be employed as information reflecting the quantity of a conductive material adhering to the microwave introduction window 16c. This is because a certain quantity of conductive material adheres to the microwave introduction window 16c every processing, and this quantity is increased as the number of processed samples is increased. Therefore, stable plasma processing can be carried out by previously setting the number of stably processible samples and removing the conductive material deposited on the microwave introduction window 16c by cleaning every time the processible number of samples are processed.

Figure 16:
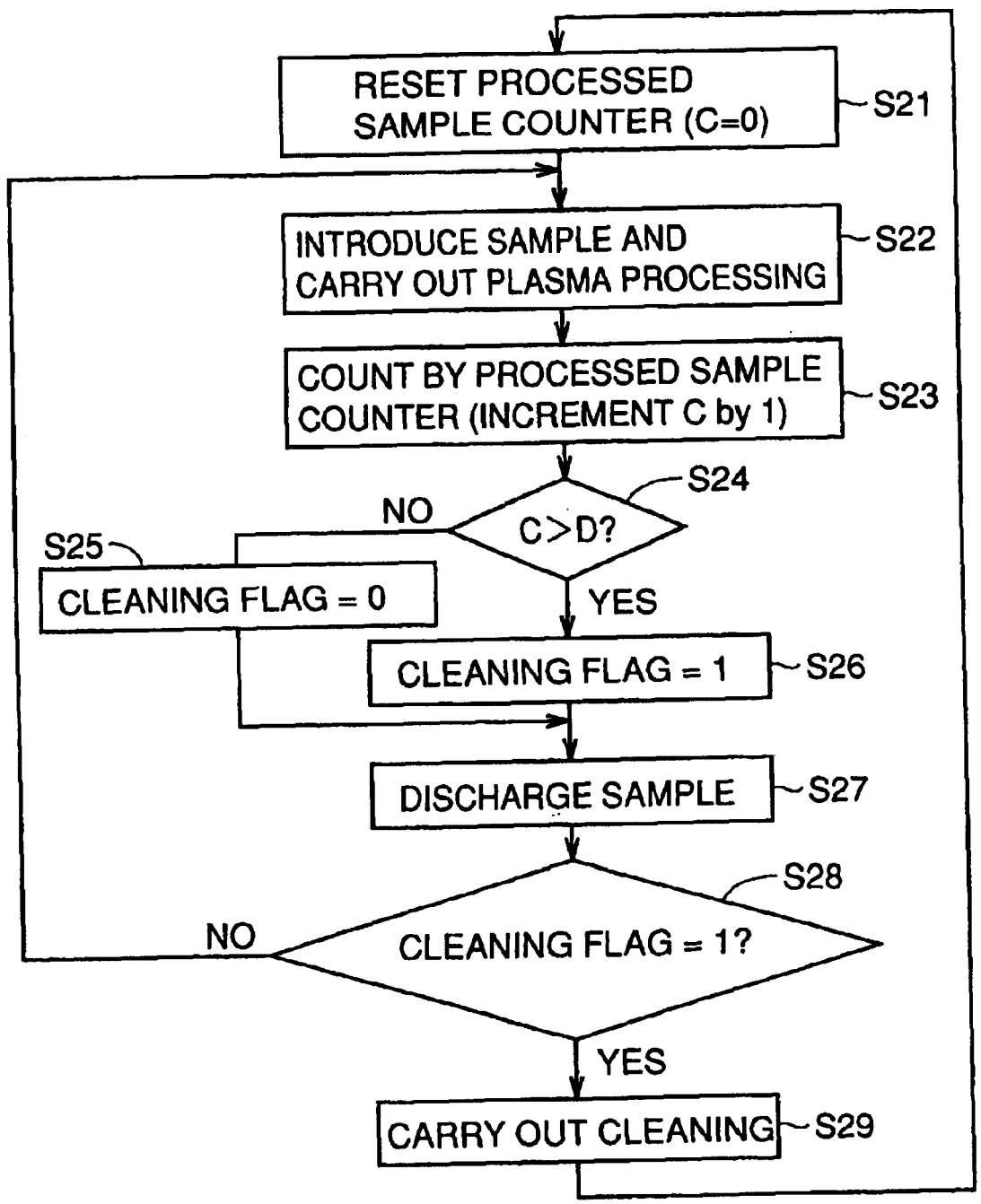
FIG. 16 is a flow chart showing cleaning according to a modification of the fourth embodiment of the present invention.

FIG. 16 is a flow chart showing plasma processing determining whether or not to clean the microwave introduction window 16c in response to the number of processed samples. At a step S21, the number C of processed samples is set to zero. The number C of processed samples can be obtained by providing a processed sample counter (not shown in FIG. 13) counting the number C of processed samples on a mechanism for introducing the sample 3. The processed sample counter is reset at the step S21, thereby setting the number C of processed samples to zero Then, the process advances to a step S22, for introducing the sample and carrying out plasma processing. When the plasma processing is terminated, the process advances to a step S23 so that the processed sample counter increments the number C of processed samples by 1. At a step S24, a determination is made as to whether or not the number C of processed samples exceeds a number D. This number D is previously set as the upper limit of the number of stably processible samples.

If the determination at the step S24 is of NO, plasma processing can be stably carried out on the next sample without cleaning the microwave introduction window 16c, and hence the process advances to a step S25 for setting the cleaning flag to zero. If the determination at the step S24 is of YES, plasma processing cannot be stably carried out on the next sample unless the microwave introduction window 16c is cleaned, and hence the process advances to a step S26 for setting the cleaning flag to 1.

After the step S25 or S26 is carried out, the process advances to a step S27 for discharging the sample subjected to plasma processing at the step S22. Then, the process advances to a step S28 for determining whether or not the cleaning flag is 1. If the cleaning flag is zero, a determination of NO is made at the step S28 and the process returns to the step S22 for introducing the next sample without cleaning the microwave introduction window 16c for carrying out plasma processing.

If the cleaning flag is 1, a determination of YES is made at the step S28 and the process advances to a step S29 for cleaning the microwave introduction window 16c. A conductive material deposited on the microwave introduction window 16c is removed when the microwave introduction window 16c is cleaned, and hence the process returns to the step S21 from the step S29 for resetting the processed sample counter.

A total processing time, reflected high-frequency power or the like can be employed as the index for determining whether or not to clean the microwave introduction window 16c. In other words, prescribed information varying with change of the plasma caused by change of the quantity of the microwave introduced into the chamber 11 due to adhesion of a conductive material to the microwave introduction window 16c as a result of plasma processing can be employed as the index for determining whether or not to clean the microwave introduction window 16c depending on whether or not this information satisfies a prescribed condition.

A dead time may be provided not to make the aforementioned determination in an unstable time immediately after generation of plasma, or the determination conditions and the determination method may be so set as to clean the microwave introduction window 16c when the index measured every second is out of the proper range continuously three times, for example, in order to more correctly clean the microwave introduction window 16c.

According to this embodiment, the sample 3 is discharged from the chamber 11 when the microwave introduction window 16c is cleaned, and hence the gas 21 generating plasma having a possibility of damaging the sample 3 can be introduced. In the above description, gas containing fluorine is illustrated as the gas for generating plasma having the possibility of damaging the substrate 31c consisting of a silicon oxide. Alternatively, another gas can be employed as the gas for generating the plasma for cleaning the microwave introduction window 16c. In other words, the microwave introduction window 16c may not necessarily be made of quartz but the degree of freedom for the material of the microwave introduction window 16c can advantageously be increased as compared with the first to third embodiments by properly selecting the gas for generating the plasma capable of etching the deposit or the microwave introduction window 16c.

Also when the gas containing fluorine is employed for etching similarly to the first to third embodiments, the microwave introduction window 16c may not be completely cleaned but the conductive material may be gradually deposited. The method according to this embodiment can be employed in order to avoid this phenomenon. In this case, plasma processing can be stably carried out over a longer period, and the frequency of the cleaning carried out while opening the chamber 11 can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma processing method comprising:

introducing a microwave through a microwave introduction mechanism into a chamber capable of storing a sample having a conductive layer; and introducing a gas consisting of a halogen element and non-halogen elements through a gas inlet port, wherein the halogen element consists solely of fluorine and any other gas introduced through the inlet port does not contain a non-fluorine halogen element, wherein the microwave and gas are introduced to process the conductive layer with plasma, wherein at least a part of said microwave introduction mechanism comprises quartz and is exposed to said plasma, and wherein said quartz of the microwave introduction mechanism is etched while the conductive layer is processed with plasma.

2. A plasma processing method comprising:

introducing a microwave through a waveguide and a microwave introduction mechanism into a chamber capable of storing a sample having a conductive layer, wherein the waveguide comprises a mechanism configured to selectively measure and control the microwave introduced into the chamber;

introducing a gas "consisting of a halogen element and non-halogen elements" through a gas inlet port wherein the halogen element consists solely of fluorine and any other gas introduced through the inlet port does not contain a non-fluorine halogen element";

processing the conductive layer with a first plasma from the microwave and gas, wherein at least a portion of the microwave introduction mechanism is exposed to the first plasma;

discharging the sample from the chamber;

cleaning the portion of the microwave introduction mechanism with a second plasma when prescribed information changed by processing said conductive layer with said first plasma satisfies a prescribed condition; and introducing said microwave from a microwave generation source into said chamber through a microwave matcher, wherein said prescribed information comprises match position information of said microwave matcher.

3. The method of claim 2, wherein said prescribed information comprises a reflected power value of said microwave.

4. The method of claim 2, wherein at least said portion of said microwave introduction mechanism comprises quartz, and said second plasma is generated from gas comprising fluorine.

5. The method of claim 1, wherein said conductive layer comprises at least one of gold, an alloy of gold, silver, an alloy of silver, copper, an alloy of copper, platinum, an alloy of platinum, indium, an alloy of indium, gallium, an alloy of gallium, germanium, an alloy of germanium, arsenic, an alloy of arsenic, phosphorus, and an alloy of phosphorus.

6. The method of claim 1, wherein said conductive layer comprises a metal oxide.

* * * * *

UNITED STATES PATENT AND TRADEMARK OFFICE
CERTIFICATE OF CORRECTION

PATENT NO. : 6,764,606 B2
DATED : July 20, 2004
INVENTOR(S) : Toshihiro Yanase

It is certified that error appears in the above-identified patent and that said Letters Patent is hereby corrected as shown below:

Title page,
Item [57], ABSTRACT,
Line 9, "potion" should read -- portion --.

Column 16,
Line 5, "consisting" should read -- consisting --.
Line 6, "elements"" should read -- elements --.
Line 6, "port wherein" should read -- port, wherein --.
Line 9, "element";" should read -- element; --.

Signed and Sealed this

Twenty-third Day of November, 2004

JON W. DUDAS
*Director of the United States Patent and Trademark Office*